Figure 1A:
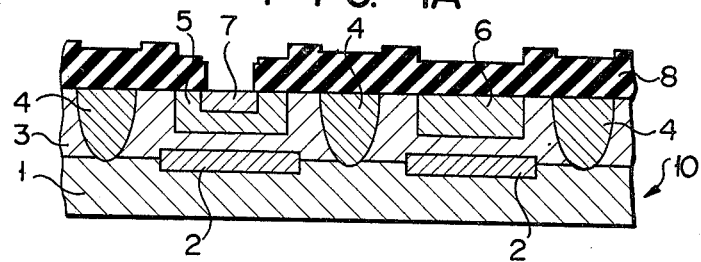

United States Patent [19]

Ajima et al.

[11] 4,123,564

[45] Oct. 31, 1978

[54] METHOD OF PRODUCING SEMICONDUCTOR DEVICE

[75] Inventors: Takashi Ajima, Tokyo; Kiyoshi Takaoki, Yokohama; Toshio Yonezawa, Yokosuka, all of Japan

[73] Assignee: Tokyo Shibaura Electric Co., Ltd., Tokyo, Japan

[21] Appl. No.: 746,897

[22] Filed: Dec. 2, 1976

[30] Foreign Application Priority Data

Dec. 3, 1975 [JP] Japan .................................. 50/144254

[51] Int. Cl.$^2$ ........................ B05D 5/12; H01L 21/22
[52] U.S. Cl. .................................. 427/85; 427/86; 427/93; 427/95; 427/248 J; 427/255; 427/259; 156/653; 156/657; 156/662; 148/187
[58] Field of Search ...................... 156/653, 659, 662; 427/85, 86, 259, 93, 95, 263, 255, 248 J; 357/59; 148/187

[56] References Cited

U.S. PATENT DOCUMENTS

| 3,632,433 | 1/1972 | Tokuyama | 427/93 |
| 3,795,557 | 3/1974 | Jacob | 156/662 |
| 3,837,905 | 9/1974 | Hile | 427/93 |
| 3,887,726 | 6/1975 | Bratter | 427/95 |
| 3,930,067 | 12/1975 | Gorrissen | 427/95 |
| 4,016,007 | 4/1977 | Wada | 427/93 |

*Primary Examiner*—Michael F. Esposito
*Attorney, Agent, or Firm*—Finnegan, Henderson, Farabow & Garrett

[57] ABSTRACT

A method of producing a semiconductor device comprises removing all of the masking films used for forming desired semiconductor regions in the substrate, newly forming a first insulation film and selectively forming a second insulation film on predetermined portions of the first insulation film by the use of a polycrystalline silicon film as the mask.

21 Claims, 10 Drawing Figures

METHOD OF PRODUCING SEMICONDUCTOR DEVICE

This invention relates to a method of producing a semiconductor device, and more particularly, to a method of producing a semiconductor device low in noise generation and high in withstand voltage.

As is well known, semiconductor devices such as transistors, diodes, integrated circuits and thyristors are produced through various processes including an epitaxial layer formation on the surface of a semiconductor substrate, a masking film formation, impurities doping, an insulation film formation, photo-etching, a metal deposition, an electrode formation, etc. In the production of, for example, an IC transistor, an epitaxial layer is formed first on a semiconductor substrate such as a silicon substrate having a buried layer formed in advance, followed by forming a masking film made of, in general, silicon dioxide. Then, predetermined portions of the masking film are removed by photo-etching and desired impurities are doped to form isolation regions. The processes of silicon dioxide masking film formation and the photo-etching are repeated to dope base impurities and, then, to dope emitter impurities. Finally, a silicon dioxide insulation film is formed, followed by metal deposition and the subsequent photo-etching of the metal layer for the electrode mounting and the wiring purpose, thereby producing an IC transistor.

Silicon dioxide film acts as both a masking film and an insulation film, and accordingly, the semiconductor device produced by the prior method retains the silicon dioxide films used as a mask in the production step. It is important to note that the masking films have been subjected to heat treatment several times in the production of the semiconductor device. It follows that the masking films inevitably contain a considerable amount of undesired alkali metal impurities, typically sodium ions, coming mainly from a heat-distribution tube used in the heating step, etc. The undesired impurities mentioned tend to form channels in the collector region and the base region of the product semiconductor device, leading to the flow of a large amount of generation-recombination current. As a result, the 1/f noise is increased and the withstand voltages between the collector and the base and between the collector and the emitter are lowered.

An object of this invention is to provide a method of producing a semiconductor device which is less likely to be influenced by undesired impurities.

Another object is to provide a method of producing a semiconductor device low in noise generation and high in withstand voltage.

These and other objects which will be apparent from the following description are attained by a method of producing a semiconductor device comprising removing all of the masking films used in one or more preceding steps of forming desired semiconductor regions within a semiconductor substrate to expose the entire surface of the semiconductor substrate; forming a first insulation film on the exposed surface of the semiconductor substrate; selectively forming a polycrystalline silicon film on the surface of the first insulation film to provide covered and uncovered portions of the first insulation film on predetermined locations of the first insulation film; and forming a second insulation film selectively on the uncovered portions of the first insulation film using the polycrystalline silicon film as a mask.

The polycrystalline silicon film is enabled to exhibit an improved passivation effect if doped with phosphorus or a combination of phosphorus and arsenic.

Figure 2:
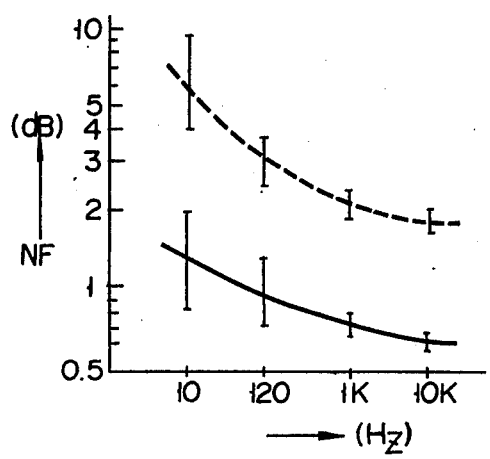
Figure 3:
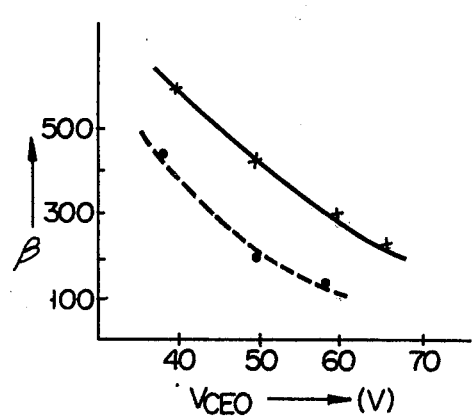

This invention will be more fully understood from the following detailed description when taken in conjunction with the appended drawings in which:

FIGS. 1A to 1H are sectional views showing the steps of forming a semiconductor device in accordance with one embodiment of this invention;

FIG. 2 is a graph showing the noise generation states for both the semiconductor device produced by the method of this invention (solid line) and that produced by the prior art method (broken line); and FIG. 3 is a graph showing the withstand voltages between the collector and the emitter for both the semiconductor device produced by the method of the invention (solid line) and that produced by the prior art method (broken line).

Described below is one embodiment of this invention. FIG. 1A shows a portion 10 for an IC device having desired impurity regions formed by ordinary processes. Specifically the portion 10 is formed as follows. First, an N-type epitaxial layer 3 is formed on a silicon wafer 1 having $N^+$ buried layers 2 formed therein. Then, a silicon dioxide film is formed by oxidation on the epitaxial layer 3 and selectively removed by photo-etching to provide a mask. P-type impurities are doped into the epitaxial layer 3 to form isolation regions 4. Those processes of silicon dioxide film formation and photo-etching are repeated and P-type impurities are doped to form a base region 5 and, at the same time, to form a resistance region 6. Further, the formation of a silicon dioxide film and photo-etching are repeated and N-type impurities are doped to form an emitter region 7. Thus the portion 10 for an IC device is obtained having a silicon dioxide film 8 consisting of the masks used in the impurity doping steps and formed on the surface of the epitaxial layer 3 as shown in FIG. 1A.

Figure 1B:
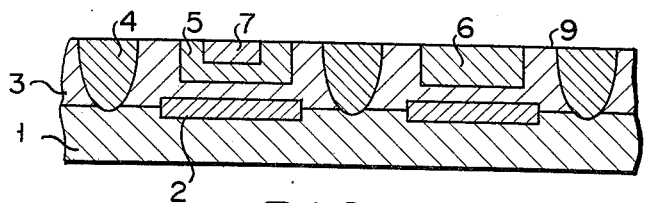

According to this invention, the masking film 8 is entirely removed by an etching solution, such as a mixture of hydrochloric acid, sulfuric acid and acetic acid or a diluted hydrofluoric acid, or by plasma etching which uses tetrafluoromethane or the like, so as to expose the entire semiconductor substrate surface 9 as shown in FIG. 1B. Incidentally, the "semiconductor substrate" mentioned refers to the portion, such as epitaxial layer 3 or silicon wafer, having a surface on which an insulation film is to be finally formed.

Figure 1C:
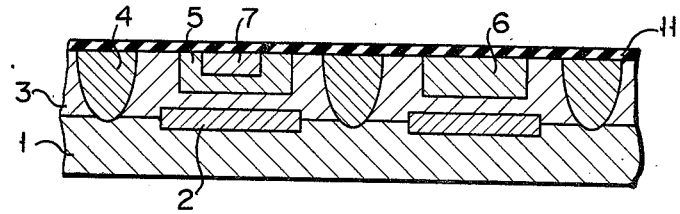

A first insulation film 11 is newly formed on the exposed semiconductor substrate surface 9 as shown in FIG. 1C. It is preferred that the film 11 be formed of the silicon dioxide ($SiO_2$) obtained by oxidation of the substrate caused by heating thereof in a mixed gas stream containing hydrogen gas, oxygen gas and a gas of a halogen-containing compound, such as hydrogen chloride or trichloroethylene. Usually, the heating is effected at about 1000° C. for about 30 minutes, thereby forming a silicon dioxide film having a thickness of about 1500Å. The silicon dioxide film thus obtained is markedly low in pin hole occurrences and does not contain sodium ions at all. Therefore, the base region or the collector region covered by the insulation film 11 is very unlikely to invite channel generation.

Figure 1D:
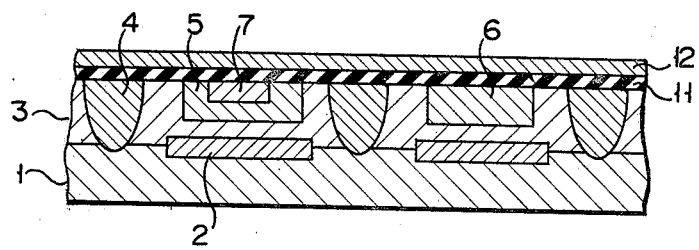

A polycrystalline silicon (poly-Si) film 12 is then formed over the entire surface of the insulation film 11 as shown in FIG. 1D. It is preferred that the poly-Si film 12 be formed by thermal decomposition of monosilane (SiH₄). Generally, the poly-Si film 12 is formed about 8000Å thick.

Figure 1E:
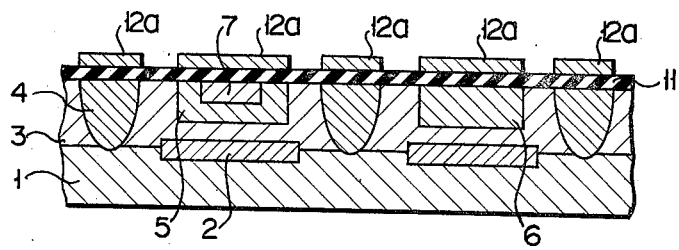

The poly-Si film 12 thus formed is selectively removed by photo-etching or plasma etching so as to provide a poly-Si film 12a selectively on those portions of the insulation film 11 below which are formed the isolation regions 4, the base region 5, the emitter region 7 and the resistance region 6, as shown in FIG. 1E. An etching solution consisting of hydrofluoric acid, nitric acid, acetic acid and iodine is preferably used for the photo-etching. On the other hand, tetrafluoromethane (CF₄) is preferably used when the selective removal of the poly-Si film 12 is effected by plasma etching.

Figure 1F:
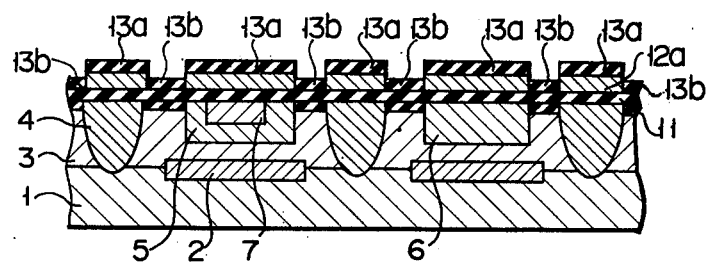

A second insulation film 13 is then formed over the exposed portions of the silicon dioxide film 11 and the poly-Si film 12a as shown in FIG. 1F. In this case, an arrangement should preferably be made such that the portions of the second insulation film formed over the poly-Si film 12a are thicker than the portions formed over the exposed portions of the first silicon dioxide film 11. The conditions permitting the above arrangement will be obvious to those skilled in the art. For example, heating is effected 2 hours at about 1100° C. in a mixed gas stream consisting of hydrogen gas, oxygen gas and a gas of a halogen-containing compound such as hydrogen chloride or trichloroethylene. The heat treatment mentioned permits forming a silicon dioxide film 13a about 5000Å thick over the poly-Si film 12a and, at the same time, a silicon dioxide film 13b about 4000Å thick over the exposed portions of the silicon dioxide film 11. It is important to note that the region beneath the poly-Si film 12a is not oxidized by this heat treatment, though the region beneath the exposed silicon dioxide film 11 is oxidized. In this sense, the heat treatment permits a selective oxidation with the poly-Si film 12a acting as the mask. The silicon dioxide film is also formed beneath the exposed portions of the first insulation film 11, i.e., within the collector region by this selective oxidation.

The presence of the silicon dioxide film within the collector region serves to prevent the channel generation which would otherwise be caused by a decreased concentration of the impurities around the surface of the base region 5. Also, local variations in resistance of the resistance region 6 can be prevented by the selective oxidation.

Further, the presence of the relatively thick silicon dioxide film 13b formed on the collector region serves to prevent the inversion of the collector region which would otherwise be caused by the voltage of the power source for operating the semiconductor device.

Figure 1G:
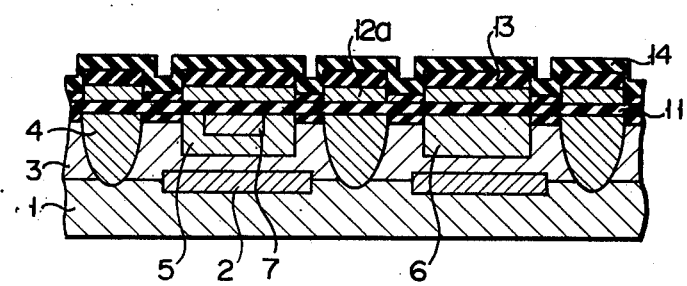

FIG. 1G shows a silicon dioxide film 14 doped with phosphorus or a mixture of phosphorus and arsenic formed on film 13. The doped film 14 is about 3000Å thick and formed by a chemical vapor deposition method, i.e., by oxidizing monosilane in the presence of phosphorus or a mixture of phosphorus and arsenic. It should be noted that the doping of phosphorus or phosphorus-arsenic serves to improve the passivation effect of the silicon dioxide film 14. Usually, phosphorus is doped in a concentration of $8 \times 10^{20}$ to $2 \times 10^{21}$ atoms/cm³. Up to the same concentration arsenic can be doped.

Figure 1H:
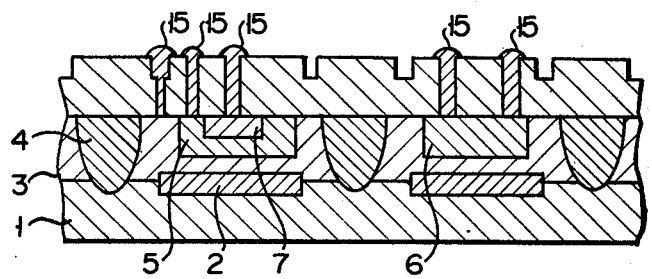

After the doped film 14 has been formed, annealing is effected for about 10 minutes at about 1000° C. under an oxidative or non-oxidative atmosphere. Then, undesired impurities are removed by washing with phosphoryl chloride (POCl₃). Finally, the silicon dioxide films are selectively etched away to expose predetermined portions of the semiconductor substrate. A metal layer, such as an aluminum layer, is then deposited and an electrode 15 is formed by selectively photo-etching the metal layer as shown in FIG. 1H.

In the embodiment described, the poly-Si film 12 was formed by thermal decomposition of SiH₄. If the thermal decomposition is carried out in the presence of phosphorus or a mixture of phosphorus and arsenic, the resultant poly-Si film 12 is doped with phosphorus or phosphorus and arsenic. In this case, the passivation effect of the poly-Si film is further improved. Phosphorus and arsenic are doped in a concentration as previously mentioned.

FIG. 2 shows the noise generation state for both and IC transistor device produced by the method described and that produced by the prior art method, namely, the transistor retaining the silicon dioxide film used as a mask in the step of forming semiconductor regions. In FIG. 2, the ordinate represents the noise factor NF in decibel dB, with the abscissa denoting the frequency Hz. The solid line relates to the case of this invention and the broken line to the case of the prior art method. The values plotted in FIG. 2 were obtained under the conditions wherein the collector current $I_C$ was 100 μA; the voltage between the collector and emitter $V_{CE}$ was 3V; and the signal source resistance Rg was 1KΩ. FIG. 2 clearly shows a big advantage of this invention over the prior art in terms of 1/f noise generation.

FIG. 3 shows the relationship between the current amplification factor $\beta$ and the withstand voltage $V_{CEO}$ between the collector and emitter for both an IC transistor device produced by the method described and that produced by the prior art method. The solid line represents the case of this invention and the broken line denotes the prior art method case. FIG. 3 clearly shows that the transistor produced according to this invention is remarkably higher in withstand voltage $V_{CEO}$ than the one produced by the prior art method. It follows that the transistor produced in accordance with this invention permits a flow of a markedly small amount of generation-recombination current on the surface of the semiconductor region, compared with the transistor produced by the prior art method.

As described in detail, the method of this invention comprises the steps of forming a clean oxide film on the surface of the semiconductor substrate having desired semiconductor regions formed therein in advance, and selectively oxidizing the predetermined portion of the semiconductor substrate using a poly-Si film as the mask. A semiconductor device thus produced is enabled to be low in noise generation and prominently high in withstand voltage.

The foregoing description relates to an embodiment of applying this invention to the production of a transistor in an IC device. But, this invention can be applied extensively to the production of semiconductor devices including, for example, diodes, thyristors, FET's, etc.

What we claim is:

1. A method of producing a semiconductor device, comprising the steps of:
   forming all desired semiconductor regions in a semiconductor substrate using masking films;
   removing all of the masking films used in forming the desired semiconductor regions within the semiconductor substrate to expose the entire surface of the semiconductor substrate;

forming a first insulation film on the exposed surface of the substrate;

selectively forming a polycrystalline silicon film on the surface of the first insulation film to provide covered and uncovered portions of the first insulation film at predetermined locations; and forming a second insulation film selectively at least on the uncovered portions of the first insulation film by using the selectively formed polycrystalline silicon film 2. A method according to claim 1, wherein the step of selectively forming the polycrystalline silicon film includes forming a continuous polycrystalline silicon film over the entire surface of the first insulation film by chemical vapor deposition comprising thermally decomposing monosilane, and subsequently selectively removing portions of the continuous film by etching to provide the uncovered portions of the first insulation film.

3. A method according to claim 2, wherein the thermal decomposition of monosilane is carried out in the presence of phosphorus or a mixture of phosphorus and arsenic.

4. A method according to claim 1, wherein the desired semiconductor regions formed in the substrate include base, emitter, resistance, and isolation regions, and wherein the polycrystalline silicon film is selectively formed on portions of the first insulation film over the base, emitter, resistance, and isolation regions.

5. A method according to claim 4, wherein the desired semiconductor regions formed in the substrate include collector regions, wherein the uncovered portions of the first insulation film extend over the collector regions, and wherein the second insulation film selectively formed on the uncovered portions of the first insulation film extends into the underlying semiconductor substrate which includes collector regions adjacent the base region.

6. A method according to claim 1, wherein the semiconductor substrate is formed of silicon.

7. A method according to claim 6, wherein the first insulation film is formed of silicon dioxide.

8. A method according to claim 7, wherein the first silicon dioxide insulation film is formed by heating the semiconductor substrate in a mixed gas stream comprising hydrogen gas, oxygen gas and a gas of a halogen-containing compound.

9. A method according to claim 8, wherein the halogen-containing compound is hydrogen chloride or trichloroethylene.

10. A method according to claim 7, wherein the second insulation film is formed of silicon dioxide.

11. A method according to claim 7, wherein the second insulation film is formed of silicon dioxide prepared by heating the semiconductor substrate in an oxidative atmosphere, said second insulation film being formed on the uncovered portions and extending into the underlying semiconductor substrate beneath the uncovered portions of the first insulation film and being formed over the selectively formed polycrystalline silicon film.

12. A method according to claim 11, further comprising the subsequent step of forming a third silicon dioxide film doped with phosphorus or a mixture of phosphorus and arsenic over the second insulation film.

13. A method according to claim 11, wherein the second insulation film is thicker on the selectively formed polycrystalline silicon film than on the uncovered portions of the first insulation film.

14. A method according to claim 11, wherein the oxidative atmosphere comprises a mixed gas of hydrogen gas, oxygen gas and a gas of a halogen-containing compound.

15. A method according to claim 14, wherein the halogen-containing compound is hydrogen chloride or trichloroethylene.

16. A method of producing a semiconductor device, comprising the steps of:

forming all desired semiconductor regions in a silicon semiconductor substrate using masking films;

removing all of the masking films used in forming the desired semiconductor regions within the silicon semiconductor substrate to expose the entire surface of the semiconductor substrate;

heating the silicon substrate in a mixed gas stream comprising hydrogen gas, oxygen gas and a gas of a halogen-containing compound to form a first silicon dioxide film on the exposed surface of the silicon substrate;

thermally decomposing monosilane to form a polycrystalline silicon film on the surface of the first silicon dioxide film;

selectively etching the polycrystalline silicon film to leave predetermined portions of the polycrystalline silicon film thereby to provide covered and uncovered portions of the first silicon dioxide film at predetermined locations;

heating the silicon substrate in a mixed gas comprising hydrogen gas, oxygen gas and a gas of a halogen-containing compound to form a second silicon dioxide film over the uncovered portions of the first silicon dioxide film and the remaining predetermined portions of the polycrystalline silicon film, said second silicon dioxide film extending into the underlying silicon substrate beneath the uncovered portions of the first silicon dioxide film; and forming a third silicon dioxide film doped with phosphorus or a mixture of phosphorus and arsenic over the second silicon dioxide film by oxidizing monsilane in the presence of phosphorus or a mixture of phosphorus and arsenic.

17. A method according to claim 16, wherein the thermal decomposition of monosilane is carried out in the presence of phosphorus or a mixture of phosphorus and arsenic.

18. A method according to claim 16, wherein the semiconductor device is a transistor having collector, base and emitter regions.

19. A method according to claim 18, wherein the first silicon dioxide film is about 1500Å thick.

20. A method according to claim 19, wherein the remaining predetermined portions of the polycrystalline silicon film are located on portions of the first silicon dioxide film corresponding to the base and emitter regions, and have a thickness of about 8000Å.

21. A method according to claim 20, wherein the second silicon dioxide film is about 4000Å thick on the uncovered portions of the first silicon dioxide film and about 5000Å thick on the remaining portions of the polycrystalline silicon film.

* * * * *